(12) United States Patent
Chang et al.

(10) Patent No.: US 11,244,948 B2
(45) Date of Patent: Feb. 8, 2022

(54) SEMICONDUCTOR DEVICE AND METHOD OF FORMING THE SAME

(71) Applicants: UNITED MICROELECTRONICS CORP., Hsin-Chu (TW); Fujian Jinhua Integrated Circuit Co., Ltd., Quanzhou (CN)

(72) Inventors: Feng-Yi Chang, Tainan (TW); Fu-Che Lee, Taichung (TW); Yi-Ching Chang, Pingtung County (TW); Kai-Lou Huang, New Taipei (TW)

(73) Assignees: UNITED MICROELECTRONICS CORP., Hsin-Chu (TW); Fujian Jinhua Integrated Circuit Co., Ltd., Quanzhou (CN)

( * ) Notice: Subject to any disclaimer, the term of this patent is extended or adjusted under 35 U.S.C. 154(b) by 0 days.

(21) Appl. No.: 16/158,317

(22) Filed: Oct. 12, 2018

(65) Prior Publication Data
US 2020/0083224 A1    Mar. 12, 2020

(30) Foreign Application Priority Data

Sep. 7, 2018   (CN) .......................... 201811042190.8

(51) Int. Cl.
*H01L 27/108*    (2006.01)

(52) U.S. Cl.
CPC .... *H01L 27/1085* (2013.01); *H01L 27/10805* (2013.01); *H01L 27/10873* (2013.01); *H01L 27/10885* (2013.01); *H01L 27/10897* (2013.01)

(58) Field of Classification Search
CPC ......... H01L 2924/1436; H01L 27/108–10897; H01L 27/10855; H01L 27/10852; H01L 27/10888; H01L 27/10808; H01L 27/1085; H01L 21/76877; H01L 21/76897; G11C 14/0009; G06F 2212/3042; G06F 2212/305
See application file for complete search history.

(56) References Cited

U.S. PATENT DOCUMENTS

| | | | |
|---|---|---|---|
| 6,093,641 A | 7/2000 | Park | |
| 7,432,194 B2 | 10/2008 | Chou et al. | |
| 9,564,343 B2 | 2/2017 | Lee et al. | |
| 2004/0051127 A1* | 3/2004 | Tanaka | H01L 23/544 257/296 |
| 2005/0032304 A1* | 2/2005 | Park | H01L 21/31116 438/253 |
| 2005/0090055 A1 | 4/2005 | Lee et al. | |

(Continued)

FOREIGN PATENT DOCUMENTS

| | | |
|---|---|---|
| CN | 1815697 A | 8/2006 |
| CN | 1885503 A | 12/2006 |
| CN | 103515230 A | 1/2014 |

*Primary Examiner* — Matthew C Landau
*Assistant Examiner* — Eric K Ashbahian
(74) *Attorney, Agent, or Firm* — Winston Hsu

(57) ABSTRACT

A semiconductor device and method of forming the same, the semiconductor device includes a substrate, a first plug, a conductive pad and a capacitor structure. The first plug is disposed on the substrate, and the conductive pad is disposed on the first plug, with the conductive pad including a recessed shoulder portion at a top corner thereof. The capacitor structure is disposed on the conductive pad, to directly in connection with thereto.

14 Claims, 7 Drawing Sheets

(56) References Cited

U.S. PATENT DOCUMENTS

| | | | |
|---|---|---|---|
| 2006/0205141 A1* | 9/2006 | Park | H01L 27/10855 438/239 |
| 2006/0292812 A1* | 12/2006 | Jung | H01L 27/10855 438/381 |
| 2007/0018224 A1* | 1/2007 | Tu | H01L 28/60 257/306 |
| 2008/0318407 A1* | 12/2008 | Eun | H01L 27/10855 438/600 |
| 2010/0244191 A1* | 9/2010 | Yu | H01L 27/10817 257/532 |
| 2011/0241102 A1* | 10/2011 | Cho | H01L 29/0649 257/329 |
| 2014/0048859 A1* | 2/2014 | Nakano | H01L 29/4975 257/296 |
| 2015/0214233 A1* | 7/2015 | Tsui | H01L 27/108 257/534 |
| 2015/0340281 A1* | 11/2015 | Lee | H01L 21/76895 438/5 |
| 2018/0247943 A1 | 8/2018 | Feng | |
| 2018/0337328 A1* | 11/2018 | Nam | H01L 43/12 |

* cited by examiner

SEMICONDUCTOR DEVICE AND METHOD OF FORMING THE SAME

BACKGROUND OF THE INVENTION

1. Field of the Invention

The present invention generally relates to the field of semiconductor devices and forming method thereof, and more particularly to a dynamic random access memory (DRAM) device and a forming method thereof.

2. Description of the Prior Art

For years the trend in the memory industry as well as the semiconductor industry has been to scale down the size of memory cells in order to increase the integration level and thus the memory capacity of DRAM chips. In a DRAM cell with a buried gate, the current leakage caused by a capacitor is often reduced or avoided thanks to a relatively long channel length beneath the buried gate. Therefore, more and more DRAM cells are equipped with buried gates rather than with a conventional planar gate structure due to their superior performances.

In general, the DRAM cells with a buried gate include a transistor device and a charge storage device, which is able to accept signals from a bit line and a word line during the operation. However, due to limitations in fabrication technologies, many defects are formed in the DRAM cell with the buried gate. Therefore, there is still a need to provide an improved memory cell with a buried gate to gain enhanced performance and reliability of the corresponding memory device.

SUMMARY OF THE INVENTION

One object of the present invention is to provide a semiconductor device and a method of forming the same, in which, a spacer is additionally formed to surround each of the mask patters while patterning the conductive pads. That is, the original dimension of each of the mask patterns is significantly increased for avoiding any dimension lost after the multiple patterning processes of the conductive pads. Through this performance, the present invention enables to form the conductive pads with an improved structure under a simplified process flow, so as to keep from any possible disconnection or poor contact issues of the storage node contacts.

To achieve the purpose described above, the present invention provides a semiconductor device including a substrate, a first plug, a conductive pad and a capacitor structure. The first plugs is disposed on the substrate, and the conductive pad is disposed on the first plug, with the conductive pad having a recessed shoulder portion at a top corner thereof. The capacitor structure is disposed on the conductive pad to directly in connection with thereto.

To achieve the purpose described above, the present invention provides a method of forming a semiconductor device including the following steps. Firstly, a substrate is provided, and a first plug is formed on the substrate. Then, a conductive pad is formed on the first plug, with the conductive pad having a recessed shoulder portion at a top corner thereof. After that, a capacitor structure is formed on the conductive pad to directly connect to the conductive pad.

In summary, the present invention provides a structure of the conductive pads and the forming method thereof, in which, the mask patterns and the additionally formed spacers surrounding the mask patterns respectively are both used to patterning the conductive pads. That is, the possible dimension loss of the mask patterns after the multiple patterning processes will be significantly improved, to make sure the predetermined dimension of the conductive pads may not be affected thereby. In this way, each of the conductive pads formed in the present invention may therefore obtain a recessed shoulder portion at the top corner thereof, with the recessed shoulder portion surrounding the top portion of each conductive pad, to compensate any possible dimension loss thereof. The recessed shoulder portion may include various profiles such as vertical shoulder shape, arc shape or petal-like shape, and the sidewalls of the capacitor structure formed subsequently may be directly located at the recessed shoulder portion, to ensure the connection between the storage node contact and the capacitor structure will no longer be affected by dislocated capacitor structures.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 1 to FIG. 4 are schematic diagrams illustrating a method of forming a semiconductor device according to a first preferred embodiment of the present invention, in which:

FIG. 1 shows a top view of a semiconductor device after forming a patterned mask layer;

FIG. 2 shows a cross-sectional view of a semiconductor device after forming a patterned mask layer;

FIG. 3 shows a top view of a semiconductor device after performing an etching process; and FIG. 4 shows a cross-sectional view of a semiconductor device after performing an etching process.

FIG. 5 to FIG. 10 are schematic diagrams illustrating a method of forming a semiconductor device according to a second preferred embodiment of the present invention, in which:

FIG. 5 shows a cross-sectional view of a semiconductor device after performing an etching process;

FIG. 6 shows a top view of a semiconductor device after forming a spacer;

FIG. 7 shows a cross-sectional view of a semiconductor device after forming a spacer;

FIG. 8 shows a cross-sectional view of a semiconductor device after performing another etching process;

FIG. 9 shows a cross-sectional view of a semiconductor device after removing the spacer and the patterned mask layer; and FIG. 10 shows a cross-sectional view of a semiconductor device after forming a bottom electrode.

DETAILED DESCRIPTION

To provide a better understanding of the present invention, preferred embodiments will be described in detail. The preferred embodiments of the present invention are illustrated in the accompanying drawings with numbered elements.

Figure 1:
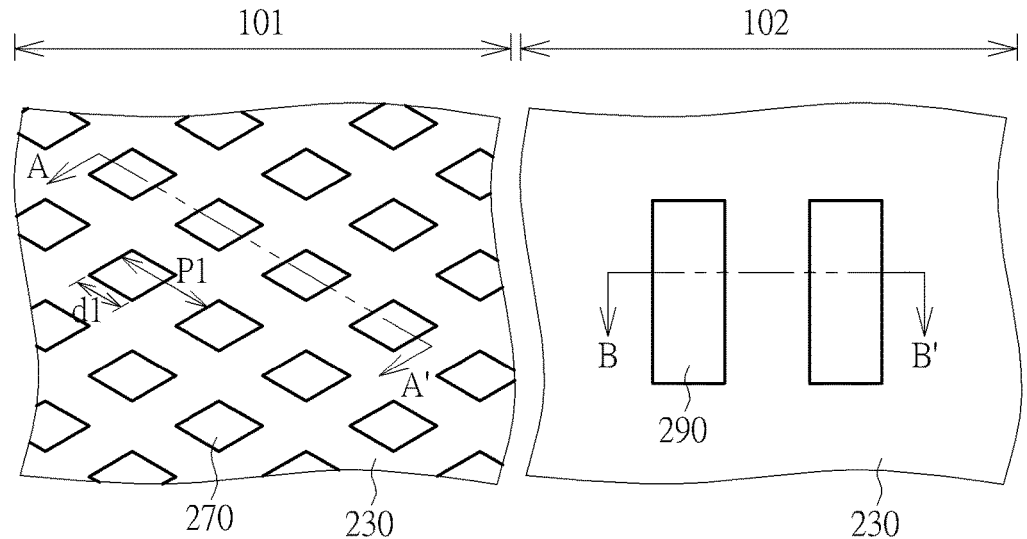
Figure 2:
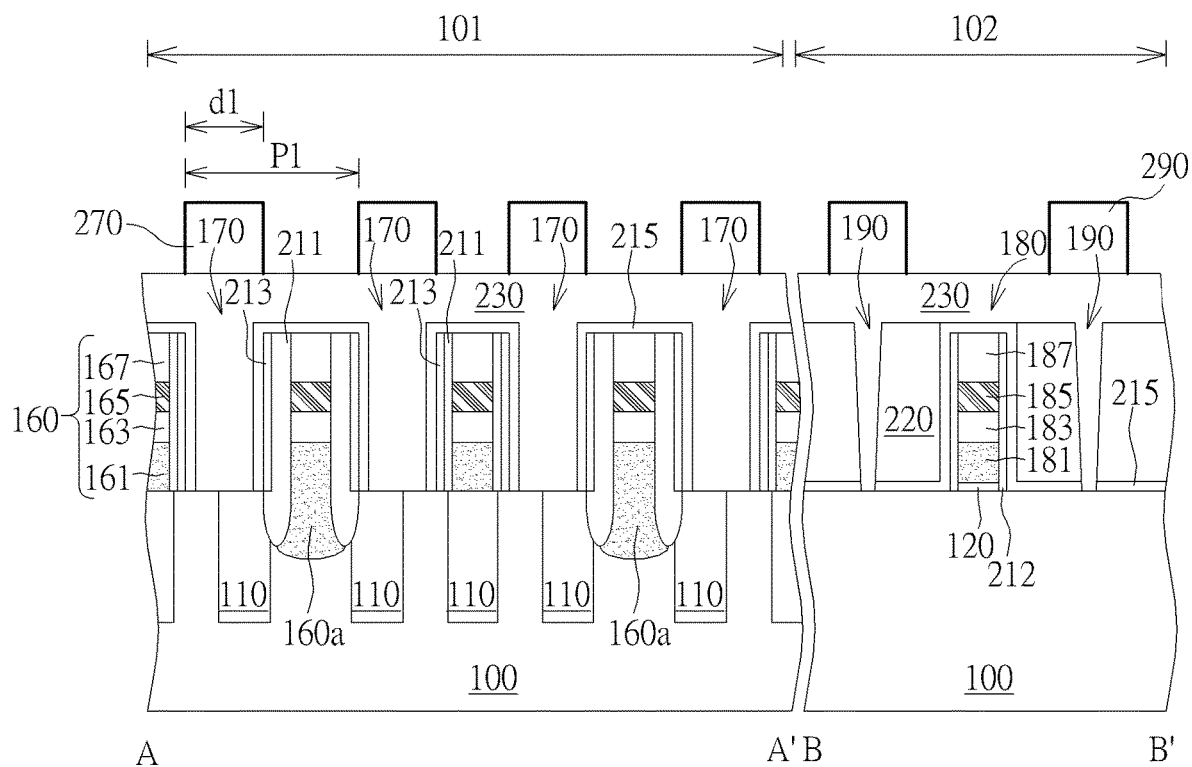
Figure 3:
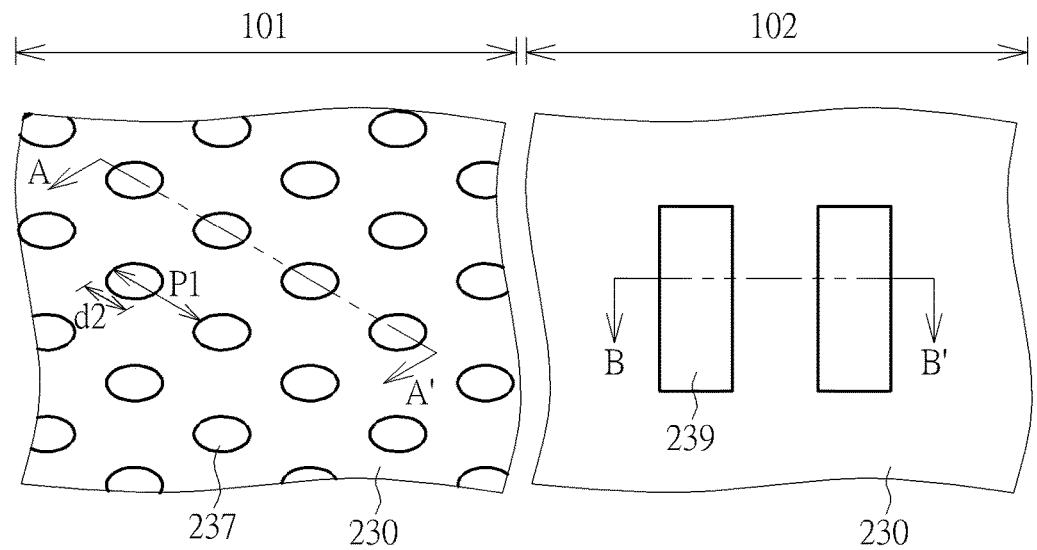

Referring to FIGS. 1-4, FIGS. 1-4 illustrate a forming method of semiconductor device according to the first preferred embodiment of the present invention, in which, FIG. 1 and FIG. 3 show a top view of a semiconductor device during the forming method respectively, and others show a cross-sectional views taken along cross lines A-A', B-B' in FIG. 1 and FIG. 3.

In the present embodiment, the semiconductor device is for example a semiconductor memory device like a dynamic random access memory (DRAM) device, but not limited thereto. Precisely, the semiconductor device includes a substrate 100 such as a semiconductor substrate like a silicon substrate, a silicon-containing substrate, an epitaxial silicon substrate or a silicon-on-insulator substrate, and a first region 101, such as a memory cell region of the semiconductor device, and a second region 102, such as a periphery region of the semiconductor device, are defined on the substrate 100, as shown in FIGS. 1-2.

In the present embodiment, at least one shallow trench isolation (STI) 110 is formed in the substrate 100 to define a plurality of active area (AAs, not shown in the drawings) in the substrate 100. The formation of the STI 110 is but not limited to be accomplished by performing an etching process to form at least one trench (not shown in the drawings) in the substrate 100, followed by forming an insulating material such as silicon oxide or silicon nitride in the trench. Also, a plurality of buried gates (not shown in the drawings) is formed in the substrate 100 within the first region 101, and those buried gates are preferably parallel extended along a direction (not shown in the drawings) to cross the AAs. That is, those buried gates are able to function like buried word lines (BWLs) of the semiconductor device. Additionally, a plurality of bit lines 160 is formed on the substrate 100, within the first region 101, and which are parallel extended along another direction (not shown in the drawings) which is perpendicular to the BWLs, to simultaneously cross the AAs and BWLs in the substrate 100.

In one embodiment, each of the bit lines 160 for example includes a semiconductor layer 161, a barrier layer 163, a metal layer 165 and a mask layer 167 stacked one over another on the substrate 100, and a portion of the bit lines 160 further includes a bit line contact (BLC) 160a disposed underneath. The bit line contacts 160a and the semiconductor layer 161 of bit lines 160 are actually monolithic, as shown in FIG. 2. On the other hand, at least one gate structure 180 is formed on the substrate 100 within the second region 102, and the gate structure 180 is actually formed in a dielectric layer 220 and for example includes a gate dielectric layer 120, a gate layer 181, a barrier layer 183, a metal layer 185 and a mask layer 187 stacked one over another on the substrate 100. In one embodiment, the gate structure 180 and each of the bit lines 160 are formed simultaneously, so that, the gate layer 181 and the semiconductor layer 161 may both include polysilicon or amorphous silicon, the barrier layer 183 and the barrier layer 163 may both include titanium (Ti) or titanium nitride (TiN), the metal layer 185 and the metal layer 165 are both include a low resistant metal such as tungsten (W), aluminum (Al) or copper (Cu), and the mask layer 185 and the mask layer 167 are both include silicon oxide, silicon nitride or silicon carbonitride (SiCN), for integrating the formations of the gate structure 180 and each of the bit lines 160.

A spacer structure and a plurality of plugs 170, 190 are then formed at two sides of each of the bit lines 160 and the gate structure 180. In the present embodiment, the spacer structure includes spacers 211/212, 213, 215, which are respectively formed through different deposition and etching processes. That is, the spacers 211/212, 213, 215 adjacent to each other may therefore include materials with various etching selectivity, such as silicon oxide, silicon oxynitride (SiON), or silicon nitride. Then, after the spacers 211/212, 213, 215 are formed, a plurality of plug trenches (not shown in the drawings) is formed in the rest space, followed by filling in a metal conductive layer 230, such as including a barrier layer (Ti/TiN, not shown in the drawings) and a low resistant metal like tungsten, so as to form the plugs 170, 190 disposed within the first region 101 and the second region 102, respectively. It is noted that, the metal conductive layer 230 not only fills up the plug trenches, but also further covers on each of the bit lines 160 and the dielectric layer 220, as shown in FIG. 2.

Next, a patterned mask layer is formed to pattern the metal conductive layer 230 covered on each of the bit lines 160 and the dielectric layer 220, thereby forming a plurality of conductive pads 237, 239 which is electrically connected to each plugs 170, 190. Precisely, the patterned mask layer includes a plurality of mask patterns 270, 290 within the first region 101 and the second region 102 respectively, with those mask patterns 270, 290 being in alignment with each plug 170, 190 underneath. In one embodiment, the mask patterns 270 are preferably formed in an array arrangement, to make each of the mask patterns 270 has the same pitch P1 such as being about 65 nanometers (nm) to 70 nm, substantially the same, regular shape such as a parallelogram-shape or a diamond-shape as shown in FIG. 1, and the same dimension d1, but is not limited thereto. On the other hand, the mask patterns 290 are parallel with each other to extend along a same direction (not shown in the drawings, such as a y-direction), as shown in FIG. 1.

Figure 4:
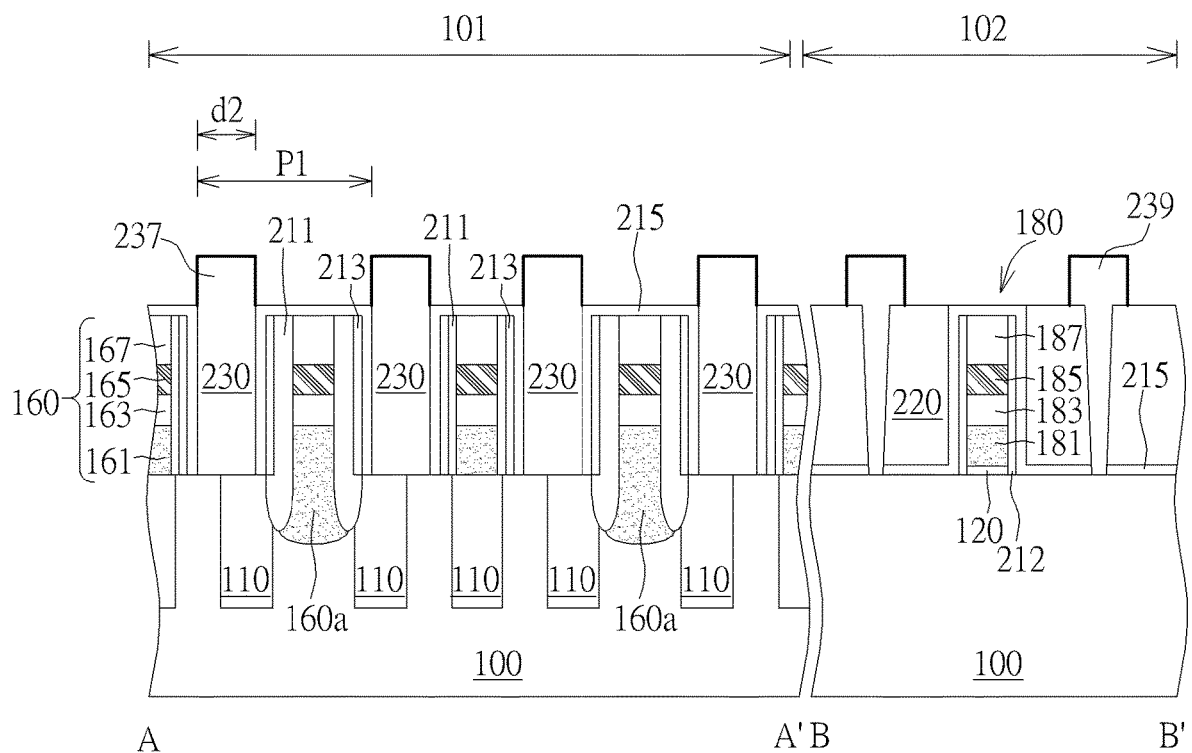

Following these, an etching process is performed through the patterned mask layer to completely remove the metal conductive layer 230 exposed from the patterned mask layer, thereby transforming the mask patterns 270, 290 within the first region 101 and the second region 102 respectively into the metal conductive layer 230 underneath. Through this performance, the metal conductive layer 230 covered on each of the bit lines 160 and the dielectric layer 220 may therefore be patterned into the conductive pads 237, 239 with each of them being separated disposed from each other to expose a portion of the spacer 215 and the dielectric layer 220, as shown in FIGS. 3-4. It is noted that, in practical formation, the conditions of the exposure process, the development process which have been performed may rounding the shape of each of the formed patterns (such as the conductive pads 237, 239), especially when the formed patterns (such as the conductive pads 237) have a relative smaller dimension and a compact layout. That is, an incomplete profile of the mask patterns 270, 290 may be presented thereby. For example, while forming the conductive pads 237 of the present embodiment, the conductive pads 237 are easy to obtain a circular shape or oval shape as shown in FIG. 3 due to the aforementioned reason.

Accordingly, the semiconductor device of the first preferred embodiment in the present invention is obtained. Through the forming method of the present embodiment, the mask patterns 270, 290 are formed within different regions 101, 102 for performing the patterning process, so as to form conductive pads 237, 239 with different layouts and dimensions in said different regions 101, 102 for electrically connecting the plugs 170, 190 underneath. In this way, each of the conductive pads 237 formed within the first region 101 may be serve as a storage node pad (SN pad), and each of the plugs 170 may therefore be electrically connected to a source/drain region (not shown in the drawings) of a transistor via a conductive layer (not shown in the drawings) formed on a surface of the substrate 100, to function like a storage node contact (SNC). On the other hand, each of the conductive pads 239 formed within the second region 102 may be serve as a conductive line, and which may be electrically connected to two source/drain regions (not shown in the drawings) at two sides of the gate structure 180 via each plug 190.

However, the formed patterns (such as the conductive pads 237, 239) are over rounding in some situation. At this point, although the pitch P1 and the layout of the conductive pads 237 are maintained, the dimension d2 of each of the conductive pad 237 is easy to lost, thereby obtaining a relative smaller dimension than that of each mask pattern 270 (such as the dimension d1). Thus, the semiconductor device formed thereby may possibly have defects like broken circuit or poor connection to the storage node contact.

People skilled in the arts may fully understand that the forming method of the present invention is not limited to be achieved through the aforementioned process and may further include other example, to meet the practical requirements of the products. The following description will detail the different embodiments of the forming method of the present invention. To simplify the description, the following description will detail the dissimilarities among the different embodiments and the identical features will not be redundantly described. In order to compare the differences between the embodiments easily, the identical components in each of the following embodiments are marked with identical symbols.

Figure 5:
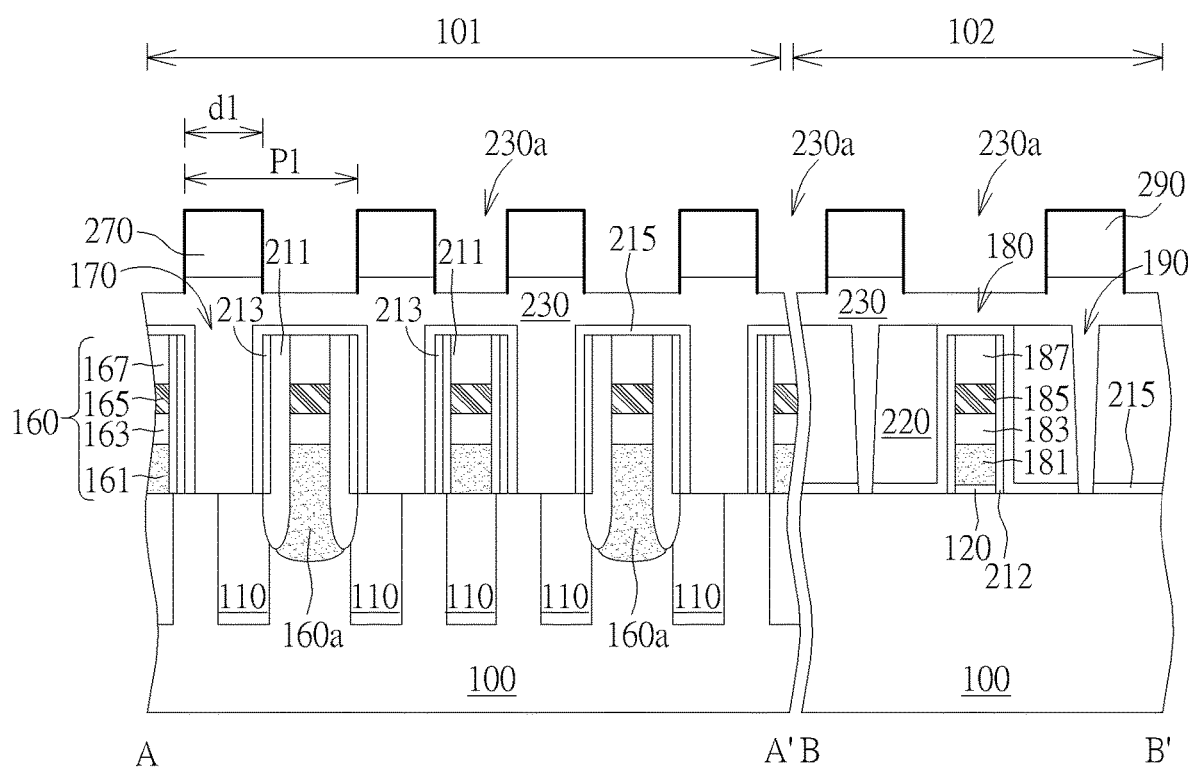
Figure 6:
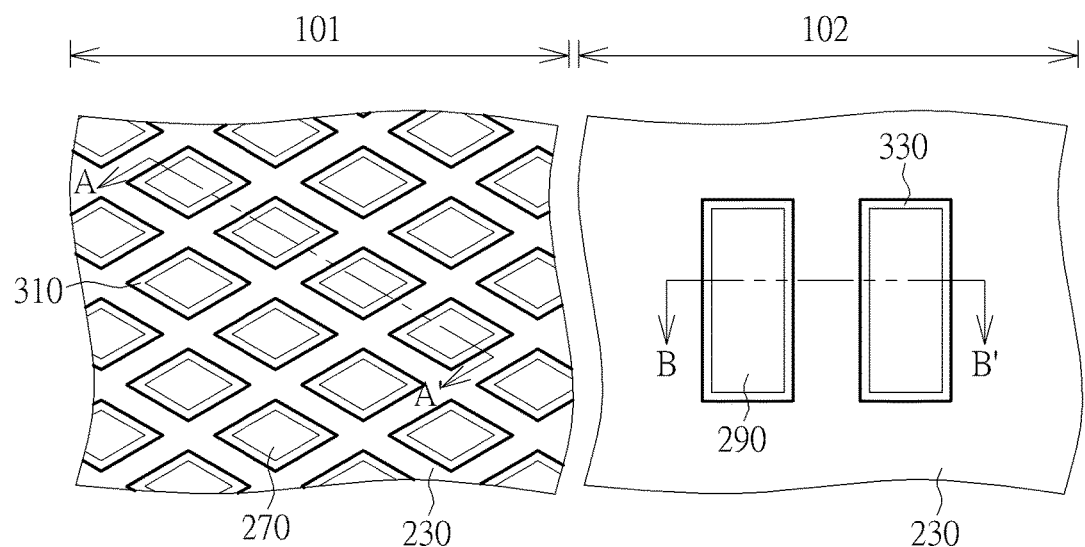

Please refer to FIGS. 5-10, which are schematic diagrams illustrating a forming process of a semiconductor device according to the second preferred embodiment of the present invention, wherein FIG. 6 shows a schematic top view of a semiconductor device during the forming process, and rest figures show a cross-sectional of a semiconductor device respectively taken along the cross lines A-A' and B-B' in FIG. 6. The formal steps in the present embodiment are similar to those in the first preferred embodiment, and which will not redundantly described herein. The differences between the present embodiment and the aforementioned first embodiment are that, after forming the structure and the patterned mask layer shown in FIG. 2, a first etching process is firstly performed through the patterned mask layer, to form a plurality of openings 230a in the metal conductive layer 230. The openings 230a are not penetrated through the metal conductive layer 230, as shown in FIG. 5. In other words, only a small portion of the metal conductive layer 230 is removed in the first etching process, without exposing the spacer 215 and the dielectric layer 220 underneath, so that, the metal conductive layer 230 covered on the bit lines 160 and the dielectric layer 220 still maintains the integrity and continuity of coverage, as shown in FIG. 5.

Figure 7:
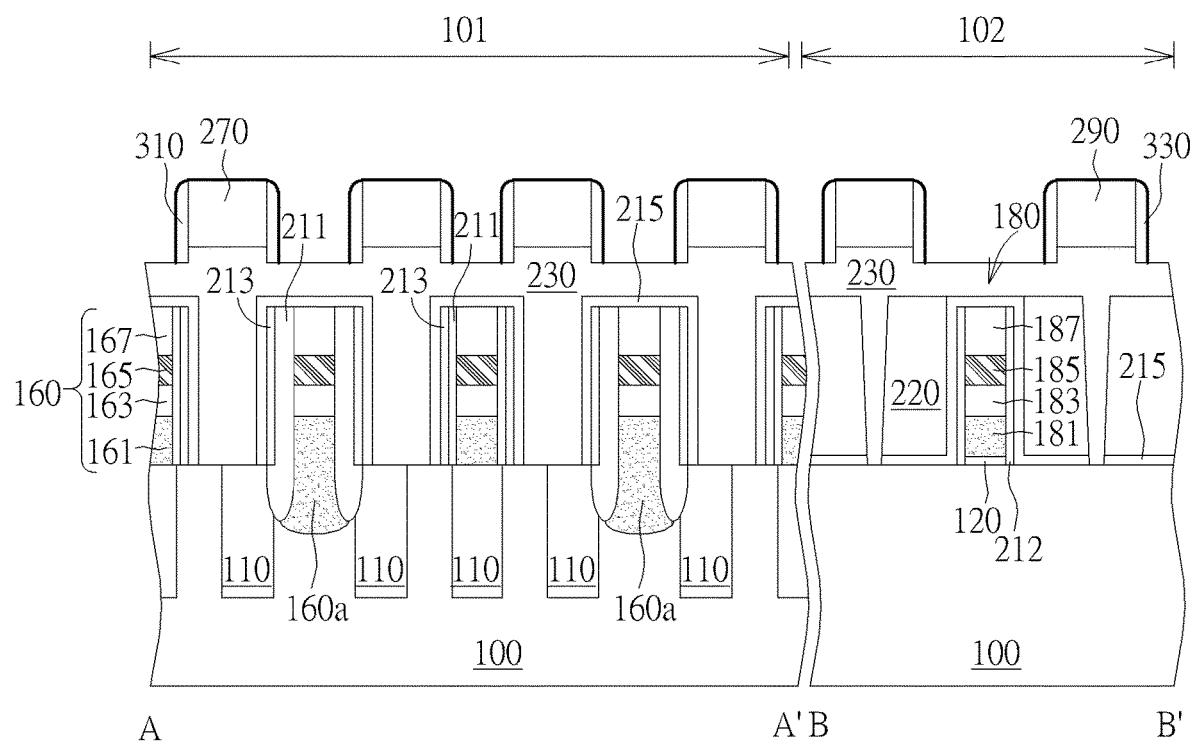

Next, spacers 310, 330 are formed to surround each of the mask patterns 270, 290. The spacers 310, 330 preferably include a material having an etching selectivity related to that of the patterned mask layer, such as silicon nitride or silicon carbonitride. In one embodiment, the patterned mask layer and the spacers 310, 330 may be formed through different deposition processes, such as an atomic layer chemical vapor deposition (ALCVD) process, for forming silicon nitride materials with different densities, but not limited thereto. The formations of the spacers 310, 330 are accomplished by firstly forming a material layer (not shown in the drawings) to entirely cover each of the mask patterns 270, 290 and the surface of each opening 230a, and performing an etching back process, to remove the material layer covered on top surfaces of the mask patterns 270, 290. Accordingly, the spacers 310, 330 are formed to be disposed around each of the mask patterns 270, 290 from a top view as shown in FIG. 6. On the other hand, the spacers 310, 330 are formed at two sides of each of the mask patterns 270, 290 from a cross-sectional view as shown in FIG. 7.

Figure 8:
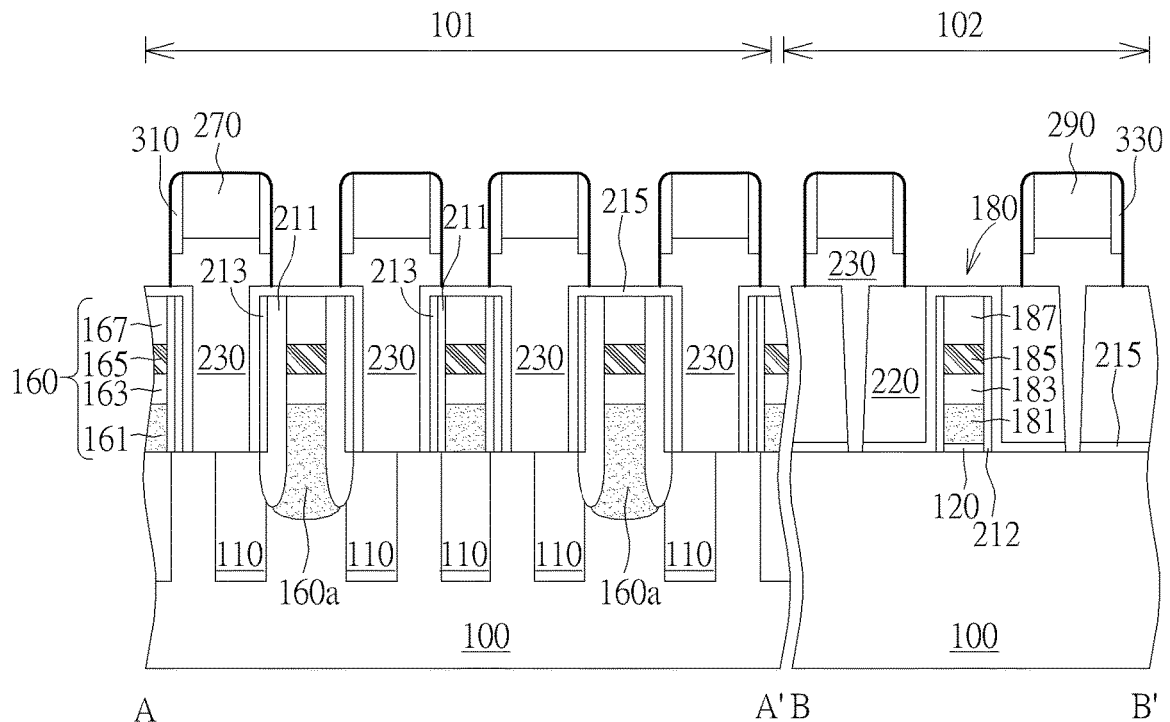
Figure 9:
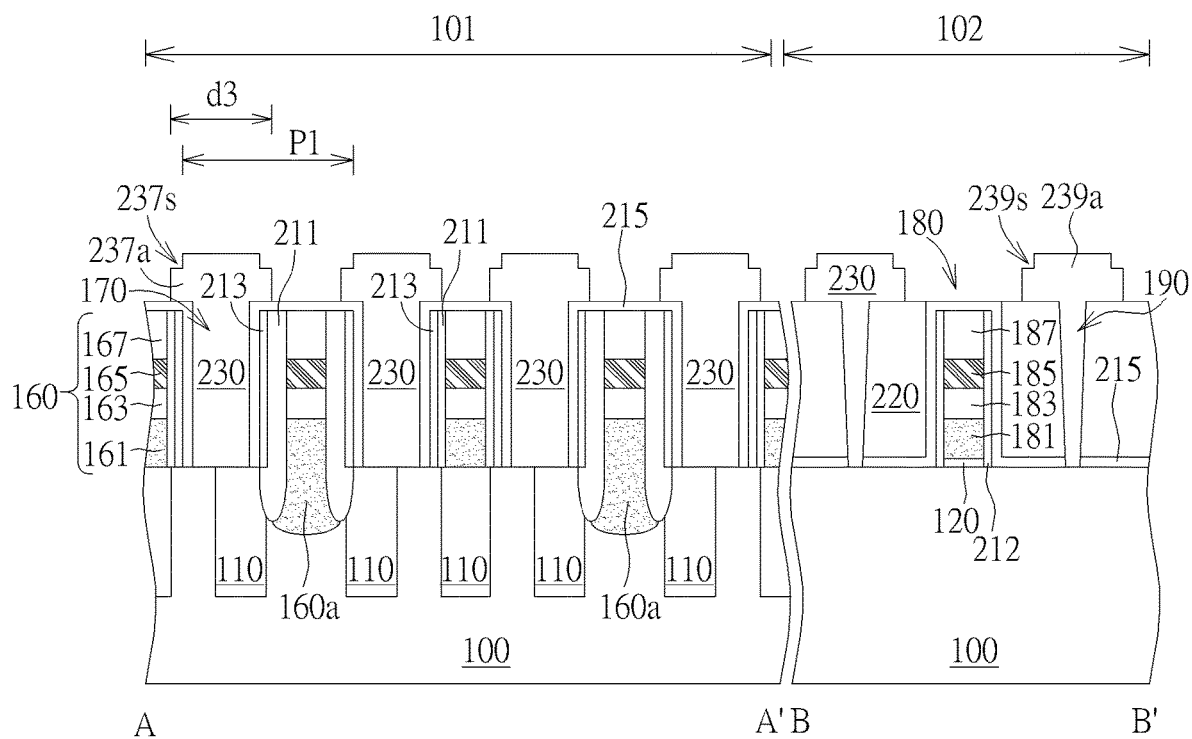

Then, a second etching process is performed also through the patterned mask layer, to further etch the metal conductive layer 230 covered on the bit lines 160 and the dielectric layer 220. That is, the mask patterns 270, 290 disposed within the first region 101 and the second regions 102 are simultaneously transferred into the metal conductive layer 230 underneath, thereby patterning the metal conductive layer 230 into conductive pads 237a, 239a which are separated from each other, as shown in FIG. 8. After that, the spacers 310, 330 and the patterned mask layer are removed sequentially, and each of the conductive pads 237a, 239a may therefore obtain a recessed shoulder portion 237s, 239s on a top corner thereof, as shown in FIG. 9. It is noted that, since the recessed shoulder portion 237s, 239s are namely formed on the positions of the spacers 310, 330, the recessed shoulder portion 237s, 239s may perform like a ring shape (not shown in the drawings) from a top view (not shown in the drawings), at the top corner of each of the conductive pads 237a, 239a.

It is noted that, the conductive pads 237a, 239a of the present embodiment are formed through simultaneously transferring the patterns both of the mask patterns 270, 290 and the spacers 310, 330, so that, the additional formed spacers 310, 330 enable to compensate the possible dimension loss of the mask patterns 270, 290 after the multiple processes, so as to avoid changing the predetermined dimension of the conductive pads 237a, 239a. In this way, the dimension d3 of each of the conductive pads 237a and the dimension of each of the conductive pads 239a will not be smaller than that of each mask pattern 270, 290. Furthermore, it is preferably to adjust the deposition thickness of the spacers 310, 330 to make the dimension d3 of the conductive pad 237a within the same pitch P1 to be substantially the same as the dimension d1 of the mask patterns 270, but not limited thereto. In one embodiment, the deposition thickness of the spacers 310, 330 may be about one sixth to one eighth of the dimension d1 of the mask patterns 270, 290 and the dimension (namely the width) of the recessed shoulder portion 237s, 239s may also be about one sixth to one eighth of the dimension d3 (namely the width) of the conductive pads 237a or the dimension of the conductive pads 239a. It is also noted that, although the top corner of each of the conductive pads 237a, 239a are exemplified to have straight and vertical profile in the present embodiment, the practical profile thereof is not limited thereto. In other embodiment, the top corner of each of the conductive pads 237a, 239a may also be rounding (not shown in the drawings) due to the cleaning or etching loading effect during the multiple patterning processes.

Accordingly, the semiconductor device of the second preferred embodiment in the present invention is obtained. Through the forming method of the present embodiment, the mask patterns 270, 290 and the spacers 310, 330 surrounding thereto are formed within different regions 101, 102 for performing the patterning process, so as to form conductive pads 237a, 239a with different layouts and dimensions in said different regions 101, 102 for electrically connecting the plugs 170, 190 underneath. In the present embodiment, the additionally formed spacers 310, 330, are used to compensate the dimension loss of the mask patterns 270, 290 caused in the multiple patterning processes, so that the formed conductive pads 237a enable to maintain the predetermined dimension d1 and the original pitch P1. That is, the conductive pads 237a, 239a of the semiconductor device in the present embodiment may therefore maintain at a predetermined dimension due to the additionally formed recessed shoulder portion 237s, 239s at a top corner thereof, and the entire width of each of the conductive pads 237a, 239a may be greater than that of the plugs 170, 190 underneath, as shown in FIG. 9. In this way, the plugs 170, 190 and the conductive pads 237a, 239a above the plugs 170, 190 respectively may actually be monolithic and perform like a cross shape, to provide a more reliable conductive structure.

Figure 10:
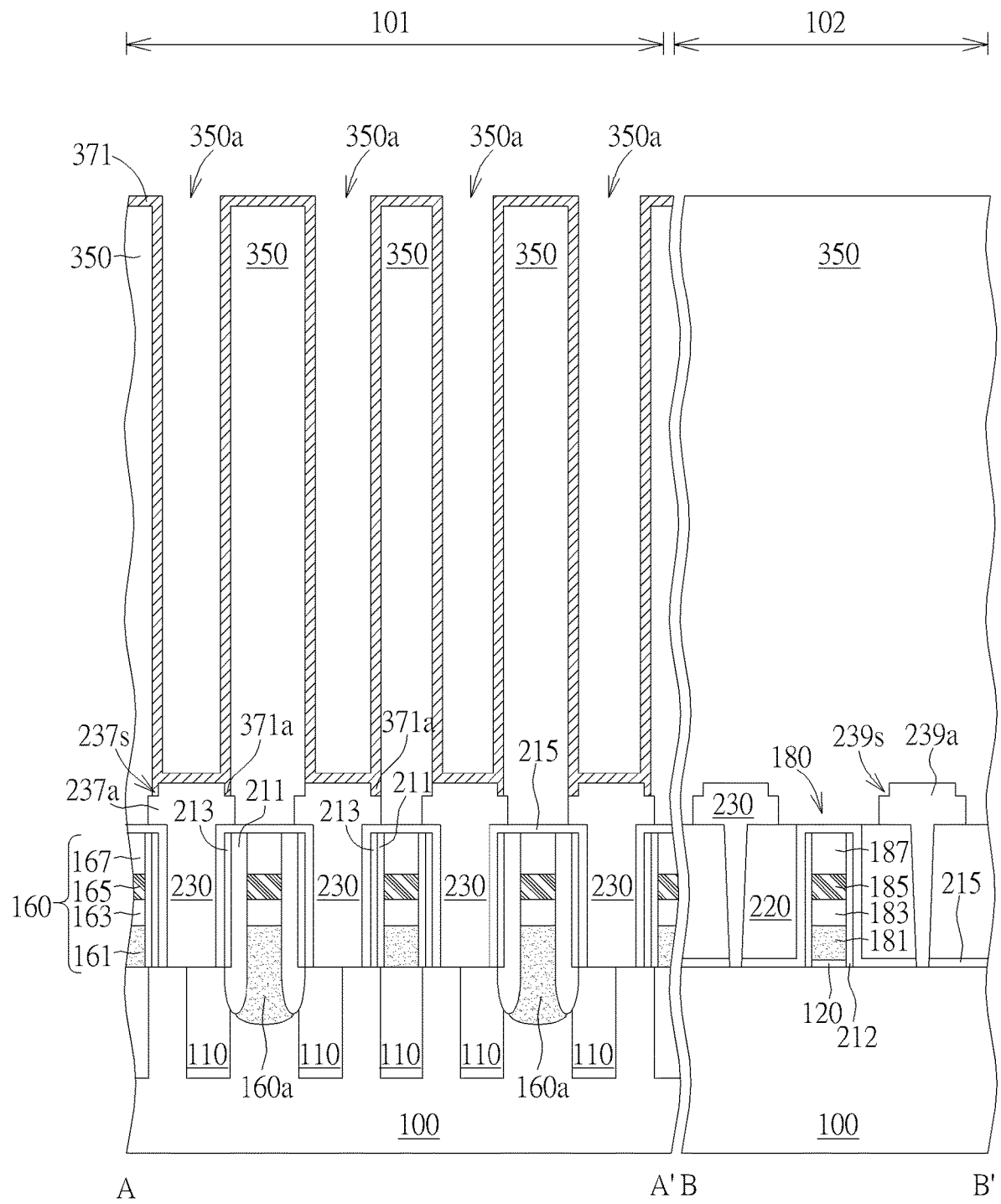

In the subsequent processes, capacitor structures (not shown in the drawings) may be formed on the substrate 100, within the first region 101, to directly contact and electrically connect to the conductive pads 237a underneath, respectively. Each of the capacitor structures may at least include a capacitor bottom electrode 371, a capacitor dielectric layer (not shown in the drawings) and a capacitor top electrode (not shown in the drawings) stacked from bottom to top. While forming the capacitor structures, a stacked layer 350 is firstly formed on the substrate 100, to define a plurality of openings 350a in the first region 101 with each of the openings 350a being in alignment with each of the conductive pads 237a underneath, followed by sequentially forming the capacitor bottom electrode 371, the capacitor dielectric layer and the capacitor top electrode in the openings 350a to form the capacitor structures. It is noted that, if each opening 350a is dislocated or the dimension of each conductive pad 237a is excessive lost while forming the capacitor structures, the connection between the storage node contacts and the capacitor structures are seriously affected thereby. However, since each conductive pads 237a of the present embodiment has the recessed shoulder portion 237s formed thereon, it is sufficient to maintain the predetermined dimension of each conductive pad 237a, and also to make sure the sidewalls of each opening 350a remained located at the recessed shoulder portion 237s when the openings 350 are dislocated, as shown in FIG. 10. Accordingly, the capacitor bottom electrode 371 filled in the openings 350 may at least partially fill in the recessed shoulder portion 237s, to form a protruding structure 371a extended downwardly. Then, the sidewalls of the capacitor structures formed thereby may be also located at the recessed shoulder portion 237a, so as to provide better connection between the capacitor structures and the storage node contact.

Figure 11:
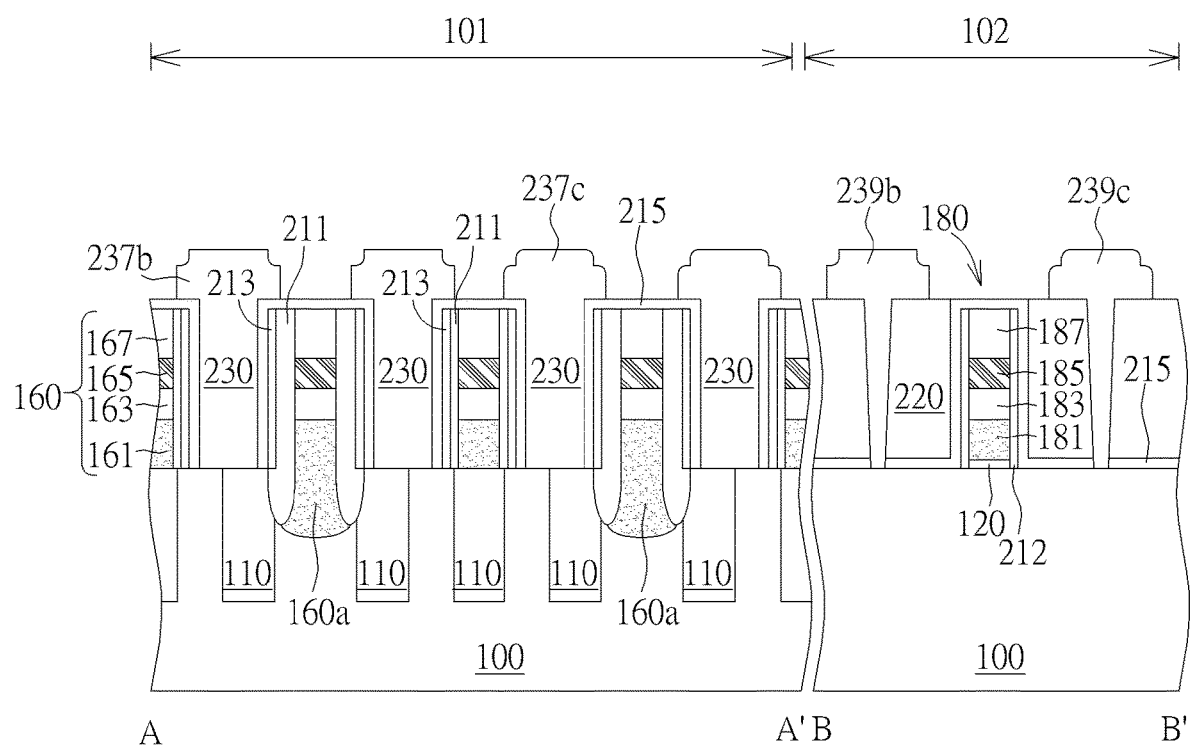
FIG. 11 is a schematic diagram illustrating a semiconductor device according to a preferred embodiment of the present invention.

Please refer to FIG. 11, which is a schematic diagram illustrating a semiconductor device according to a preferred embodiment of the present invention. The formation of the semiconductor device in the present embodiment is substantially the same as those in the aforementioned second preferred embodiment, and which will not be redundantly described hereinafter. The difference between the semiconductor device in present embodiment and the semiconductor device in the second preferred embodiment is main in the profile of the recessed should portion of each conductive pads. While forming the conductive pads 237b, 237c, 239b, 239c, the practical etching conditions may further rounding each corner of the patterns, so that, the recessed shoulder portion of each of the conductive pads 237b, 237c, 239b, 239c may therefore obtain different profiles as shown in FIG. 11, such as a recessed arc shape or a petal-like shape, but not limited thereto. Those conductive pads 237b, 237c, 239b, 239c with recessed shoulder portions in various shapes may still enable to compensate the possible dimension loss of the original mask patterns 270, 290, to make sure the predetermined dimensions of the conductive pads 237b, 237c, 239b, 239c will not be affected thereby. Thus, it is sufficient to ensure the better connection between the storage node contact and the capacitor structure.

Furthermore, although the recessed shoulder portion of the aforementioned embodiments are all present in a recessed profile, but the practical profile is not limited thereto. In another embodiment, a spacer (not shown in the drawings) having a conductive material may be formed around each of the mask patterns 270, 290, with the conductive material being the same or different from that of the metal conductive layer 230. Through this arrangement, after patterning the conductive pads, the said spacer with the metal material may be optionally not removed or partially removed, to leave a protruded shoulder portion (not shown in the drawings) remained on a top corner of each of the conductive pads.

Overall speaking, the present invention provides a structure of the conductive pads and the forming method thereof, in which, the mask patterns and the additionally formed spacers respectively surrounding the mask patterns are both used to patterning the conductive pads. That is, the possible dimension loss of the mask patterns during the multiple patterning processes will be significantly improved, to make sure the predetermined dimension of the conductive pads may not be affected thereby. In this way, each of the conductive pads formed in the present invention may therefore obtain a recessed shoulder portion at the top corner thereof, with the recessed shoulder portion surrounding the top portion of each conductive pad, to compensate any possible dimension loss thereof. The recessed shoulder portion may include various profiles such as vertical shoulder shape, arc shape or petal-like shape, and the sidewalls of the capacitor structure formed subsequently may be directly located at the recessed shoulder portion, to ensure the connection between the storage node contact and the capacitor structure will no longer be affected by dislocated capacitor structures. Also, people skilled in the arts may fully understand that although the method of forming a semiconductor memory device like a dynamic random access memory (DRAM) device is exemplified in the present invention, the practical application of the forming method in the present invention is not limited thereto. In another embodiment, the forming method in the present invention may also be applied on other semiconductor processes, to form conductive pads or other connection elements with an improved structure under a simplified process and reduced cost, thereby avoiding any possible broken circuit or poor connection issues of the interconnection system.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor device, comprising:
   a substrate;
   a first plug disposed on the substrate;
   a bit line disposed on the substrate, wherein the bit line is disposed adjacent to the first plug;
   a spacer structure between the bit line and the first plug;
   a conductive pad disposed on the first plug, wherein the conductive pad is protruded from top surfaces of the bit line and the spacer structure, and the conductive pad directly contacts the top surface of the spacer structure and comprises a recessed shoulder portion at a top corner of the conductive pad; and a capacitor structure disposed on the conductive pad, wherein a coverage area of the entire capacitor structure is completely disposed within a coverage area of the entire conductive pad in a projection direction to directly be in connection with the conductive pad, a sidewall of the capacitor structure is disposed at the recessed shoulder portion of the conductive pad, and the capacitor structure further comprises a bottom electrode and the bottom electrode fills in the recessed shoulder portion of the conductive pad.

2. The semiconductor device according to claim 1, wherein the top corner are rounding at the recessed shoulder portion.

3. The semiconductor device according to claim 1, wherein the recessed shoulder portion has an arc shape or a petal-like shape.

4. The semiconductor device according to claim 1, wherein the recessed shoulder portion has a width which is about one sixth to one eighth of a width of the conductive pad.

5. The semiconductor device according to claim 1, wherein the substrate comprises a first region and a second region, the bit line and the first plug are all disposed within the first region.

6. The semiconductor device according to claim 5, further comprising:
a gate structure disposed on the substrate within the second region; and
a second plug disposed on the substrate within the second region, the second plug being in connection with a source/drain region disposed at two sides of the gate structure; and
another conductive pad disposed on the second plug, the another conductive pad comprising a recessed shoulder portion at a top corner of the another conductive pad.

7. The semiconductor device according to claim 1, wherein the conductive pad and the first plug are monolithic.

8. A method of forming a semiconductor device, comprising:
providing a substrate;
forming a first plug on the substrate;
forming a bit line on the substrate, wherein the bit line is disposed adjacent to the first plug;
forming a spacer structure between the bit line and the first plug;
forming a conductive pad on the first plug, wherein the conductive pad and the first plug are monolithic to form a cross structure, and a horizontal portion of the cross structure is disposed on a top surface of the spacer structure and comprises a recessed shoulder portion at a top corner of the conductive pad; and
forming a capacitor structure on the conductive pad, wherein a coverage area of the entire capacitor structure is completely disposed within a coverage area of the entire conductive pad in a projection direction to directly connect to the conductive pad.

9. The method of forming a semiconductor device according to claim 8, wherein forming the conductive pad further comprises:
forming a conductive layer on the substrate;
forming a patterned mask layer on the conductive layer; and
performing a first etching process through the patterned mask layer, to form an opening at a top portion of the conductive layer.

10. The method of forming a semiconductor device according to claim 9, further comprising:
forming a spacer on sidewalls of the patterned mask layer and the opening; and
performing a second etching process through the patterned mask layer and the spacer, to form the conductive pad.

11. The method of forming a semiconductor device according to claim 10, further comprising:
after forming the conductive pad, removing the patterned mask layer and the spacer to form the recessed shoulder portion of the conductive pad.

12. The method of forming a semiconductor device according to claim 8, wherein forming the capacitor structure further comprises:
forming a bottom electrode to fill in the recessed shoulder portion.

13. The method of forming a semiconductor device according to claim 8, wherein the substrate comprises a first region and a second region, the bit line and the first plug are both formed within the first region.

14. The method of forming a semiconductor device according to claim 13, further comprising:
forming a gate structure on the substrate within the second region;
forming a second plug on the substrate within the second region, to electrically connect to a source/drain region disposed at two sides of the gate structure; and
forming another conductive pad on the second plug, the another conductive pad comprising a recessed shoulder portion at a top corner of the another conductive pad.

* * * * *